(12) United States Patent
Lee

(10) Patent No.: US 12,197,777 B2
(45) Date of Patent: Jan. 14, 2025

(54) SEMICONDUCTOR MEMORY DEVICE

(71) Applicant: SK hynix Inc., Icheon-si (KR)

(72) Inventor: Dong Sop Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 59 days.

(21) Appl. No.: 18/159,518

(22) Filed: Jan. 25, 2023

(65) Prior Publication Data

US 2024/0004580 A1 Jan. 4, 2024

(30) Foreign Application Priority Data

Jun. 29, 2022 (KR) .......................... 10-2022-0079376

(51) Int. Cl.
*G06F 3/06* (2006.01)
*G06F 13/38* (2006.01)
*G06F 13/42* (2006.01)

(52) U.S. Cl.
CPC .......... *G06F 3/0658* (2013.01); *G06F 3/0622* (2013.01); *G06F 3/0685* (2013.01); *G06F 13/385* (2013.01); *G06F 13/4226* (2013.01); *G06F 2213/0026* (2013.01)

(58) Field of Classification Search
None
See application file for complete search history.

(56) References Cited

U.S. PATENT DOCUMENTS

| 11,114,178 | B1* | 9/2021 | Eliash | G11C 16/10 |
| 11,556,420 | B2* | 1/2023 | Wang | G06F 13/1668 |
| 2009/0168525 | A1* | 7/2009 | Olbrich | G11C 7/1063 |
| | | | | 365/185.11 |

* cited by examiner

*Primary Examiner* — Farley Abad
*Assistant Examiner* — Dayton Lewis-Taylor
(74) *Attorney, Agent, or Firm* — Perkins Coie LLP

(57) ABSTRACT

The present disclosure relates to a semiconductor memory device including various types of memories to which a host is connected. The semiconductor memory device in one implementation includes a storage memory comprising a nonvolatile memory and a nonvolatile memory controller configured to control the nonvolatile memory; a main memory comprising a volatile memory and a volatile memory controller configured to control the volatile memory; and an access controller communicatively coupled to the storage memory and the main memory and configured to perform data communication with an external device based on a first protocol, perform data communication with the storage memory based on a second protocol, perform data communication with the main memory based on a third protocol, and control access from the external device to the storage memory and the main memory.

20 Claims, 10 Drawing Sheets

SEMICONDUCTOR MEMORY DEVICE

CROSS-REFERENCE TO RELATED APPLICATION(S)

This patent document claims, under 35 U.S.C. 119(a), the benefit of priority of Korea Patent Application No. 10-2022-0079376, filed Jun. 29, 2022, the entire contents of which is incorporated herein for all purposes by this reference.

TECHNICAL FIELD

Various embodiments relate to a semiconductor memory device and more particularly to a structure of a semiconductor memory device including various types of memories to which a host is connected.

BACKGROUND

In a data storage device of computing devices or communication devices, including mobile devices such as laptops, tabs, PDAs, and mobile phones, a volatile memory that has a fast data processing speed and temporarily stores data is used as a main memory, and a nonvolatile memory that can retain the stored data even when power is not applied is used as a storage memory.

In the past, the main memory and the storage memory are packaged separately in memory systems for some mobile devices. However, in order to reduce the size and power consumption of the mobile device, the main memory and the storage memory are packaged together with a controller in the form of a multi-chip package.

In configuring the multi-chip package, as the size of the package decreases, the number of connection electrodes that the package can use as input and output may be limited.

SUMMARY

Various embodiments of the present disclosure can be implemented to provide a multi-chip package structure capable of reducing the number of connection electrodes and the size of the package as much as possible and capable of optimizing the performance with which a host accesses a main memory and a storage memory.

A specific example for one embodiment of the technology disclosed in the present disclosure is an access controller including: a first interface configured to perform data communication based on a first protocol with a first external device; a second interface configured to perform data communication based on a second protocol with a second external device comprising a nonvolatile memory; a third interface configured to perform data communication based on a third protocol with a third external device comprising a volatile memory; a controller communicatively coupled to the second external device and configured to control an access to the nonvolatile memory; and a link communicatively coupled to the first interface, the second interface, and the third interface and configured to process a first message received through the first interface, generate a second message based on the second protocol and transmit the second message to the second external device through the second interface, generate a third message based on the third protocol and transmit the third message to the third external device through the third interface, or transmit the processed first message to the controller.

Another specific example of an embodiment of the disclosed technology is a semiconductor memory device including: a storage memory comprising a nonvolatile memory and a nonvolatile memory controller configured to control the nonvolatile memory; a main memory comprising a volatile memory and a volatile memory controller configured to control the volatile memory; and an access controller communicatively coupled to the storage memory and the main memory and configured to perform data communication with an external device based on a first protocol, perform data communication with the storage memory based on a second protocol, perform data communication with the main memory based on a third protocol, and control access from the external device to the storage memory and the main memory.

In some implementations, the semiconductor memory device in the above examples may further include a substrate. The access controller chip is disposed on the substrate. The plurality of main memory chips is stacked on the substrate vertically on both sides spaced apart from the access controller chip. The plurality of storage memory chips is disposed on the plurality of main memory chips disposed on both sides of the access controller chip while being vertically stacked.

The above and other features of embodiments of the disclosed technology are described in more detail in the drawings, the detailed description and the claims of the present disclosure.

DETAILED DESCRIPTION

Figure 1:
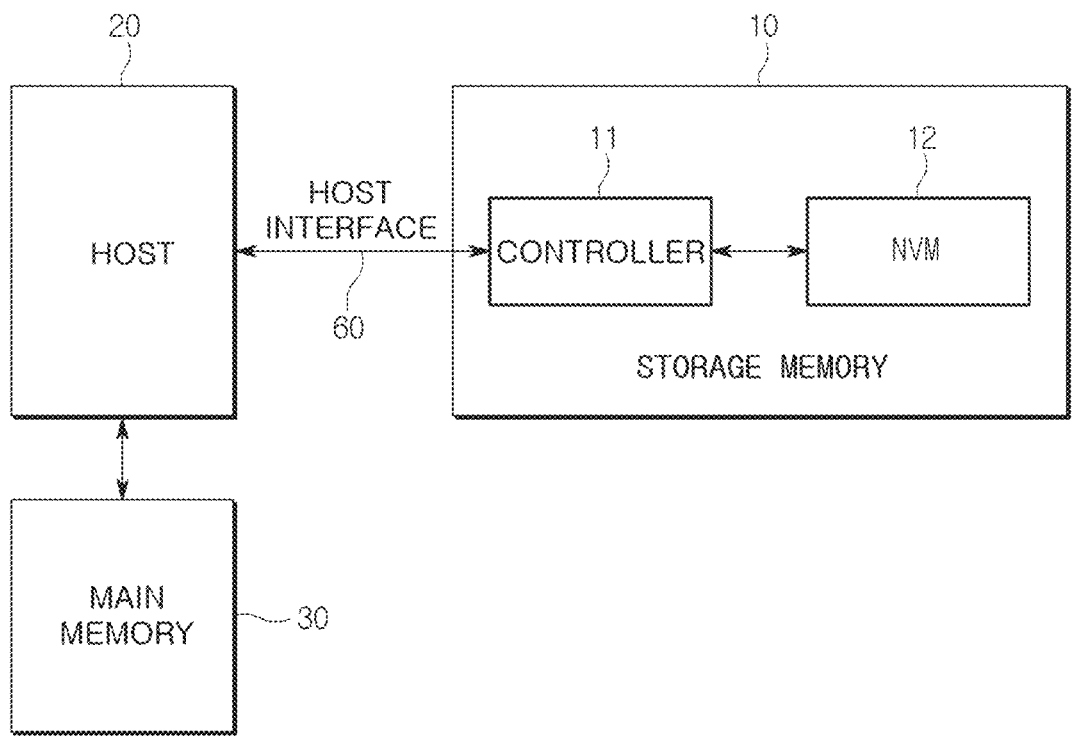
FIGS. 1 to 3 show examples of a structure in which a host is connected to a main memory and a storage memory in an electronic device.

Various implementations of the disclosed technology will be described in detail by referring to the following descriptions as well as the accompanying drawings. The same reference numerals throughout the disclosure correspond to the same elements.

In some implementations, an application processor (AP), a central processing unit (CPU), or a host of an electronic device is connected to a main memory composed of or including a volatile memory that has a high data processing speed and can temporarily store data and to a storage memory composed of a nonvolatile memory that can maintain the stored data even when power is not applied, so that it is possible to perform required operations.

In the example, the host may be connected to the main memory and the storage memory in various structures.

Figure 2:
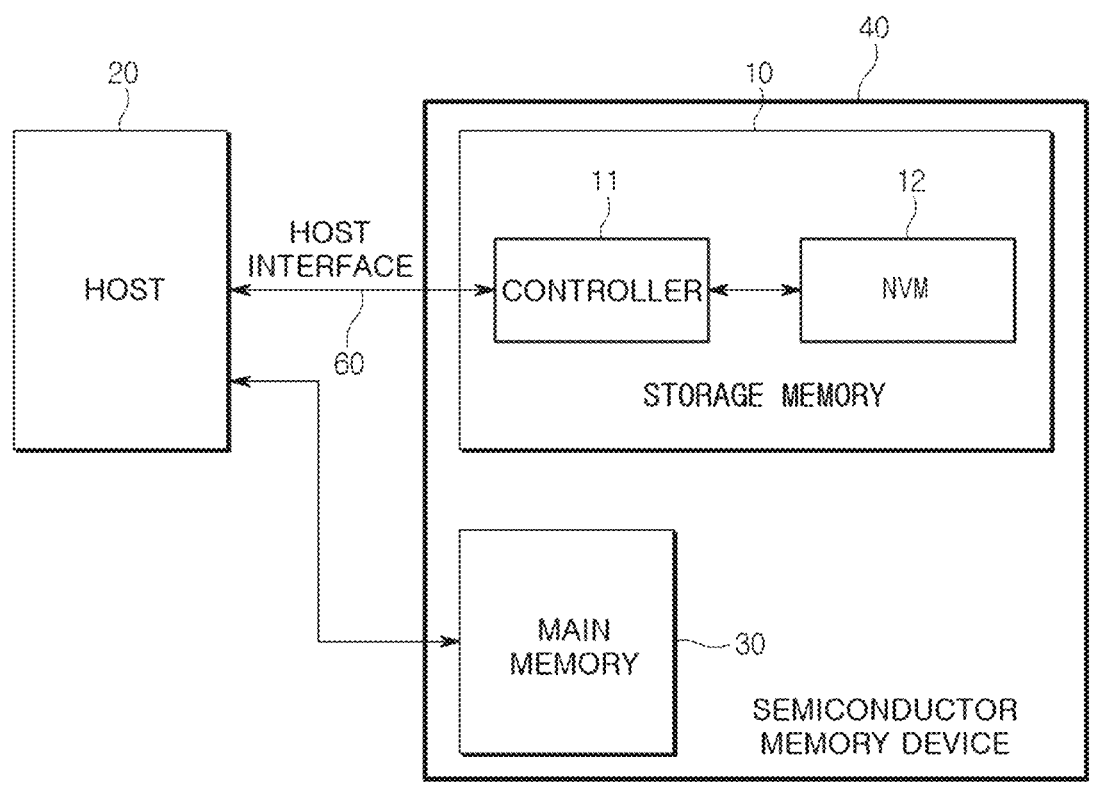
Figure 3:
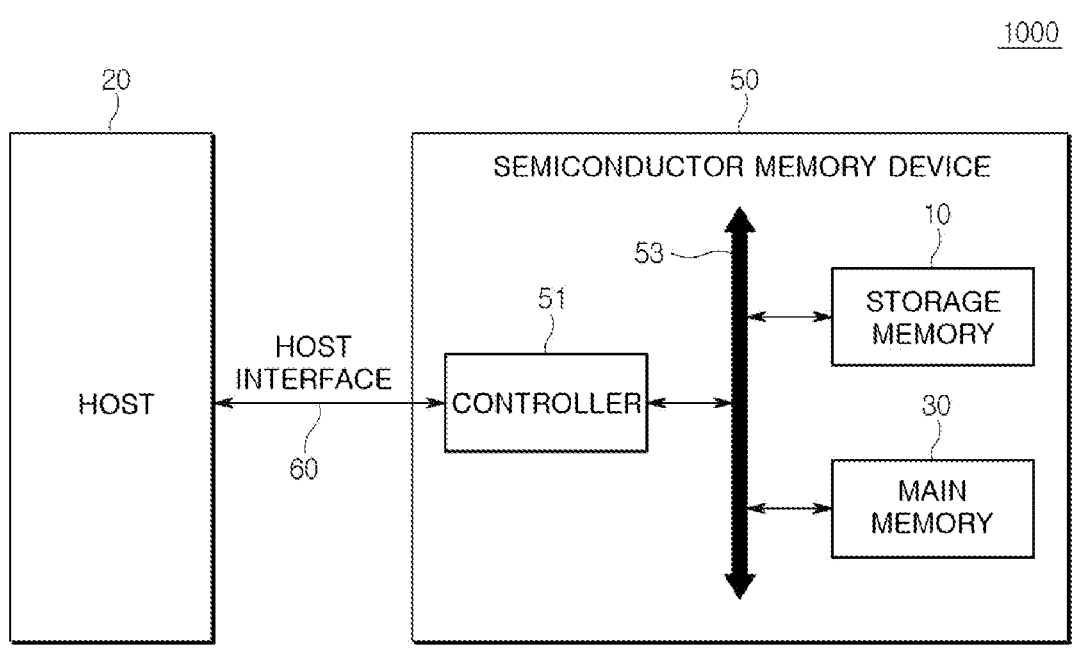

FIGS. 1 to 3 show examples of a structure in which the host is connected to the main memory and the storage memory in an electronic device.

Referring to FIG. 1, an electronic device may include a main memory 30 and a storage memory 10 which are directly connected to the host 20 and provided separately. The storage memory 10 may include a controller 11 and a nonvolatile memory (NVM) 12. The controller 11 of the storage memory 10 may be connected to the host 20 through a host interface, and the host interface may use a variety of interface methods including a universal flash interface (UFS), NVMe, PCIe, or others. The host 20 may be connected to the main memory 30 through a double data rate (DDR) interface and may directly control the main memory 30 to store or read data. The main memory 30 may be a DDR synchronous dynamic random-access memory (SDRAM), and when the electronic device is a mobile device, the main memory 30 may be a low power double data rate synchronous dynamic random-access memory (LPDDR SDRAM).

In the case of the structure of the electronic device shown in FIG. 1, the host 20 has the DDR interface and the host interface, and as the number of external connection electrodes increases, the package size and manufacturing cost of the host 20 may be increased accordingly. In addition, since the main memory 30 and the storage memory 10 are composed of separate chips or modules and occupies a separate space, the overall size of the electronic device may be increased. When the universal flash interface is used as the host interface, a basic delay time may be required to read and write data by serial data transmission.

Referring to FIG. 2, the structure proposed in FIG. 2 shows that the main memory 30 and the storage memory 10 are provided within a semiconductor memory device 40 composed of a single memory chip. Unlike the structure of FIG. 1, since the storage memory 10 and the main memory 30 are provided within one module, the overall size of the electronic device can be reduced.

In the structure of FIG. 2, the controller 11 of the storage memory 10 is connected to the host 20 through the host interface and the main memory 30 is connected to the host 20 through the DDR interface. In this case, a memory access operation of the host 20 can be used while maintaining the operation used in the structure of FIG. 1 without any modification such as modification of the interface. However, since the semiconductor memory device 40 needs two host connection interfaces including the DDR interface and the host interface (e.g., UFS, NVMe, PCIe), the number of external connection terminals required increases, and thus, the overall size of the chip may be increased.

Referring to FIG. 3, in the structure proposed in FIG. 3, in a similar manner to FIG. 2, the main memory 30 and the storage memory 10 are provided within a semiconductor memory device 50 implemented as a single memory chip. In the example as shown in FIG. 3, the DDR interface is removed in the connection interface with the host 20 and only one host interface is provided.

Unlike the structure of FIG. 1 but similar to the structure of FIG. 2, since the storage memory 10 and the main memory 30 are provided in a single chip, the overall size of the electronic device can be reduced.

Also, unlike the structure of FIG. 2, since the storage memory 10 and the main memory 30 are connected through one host interface, the number of external connection terminals required by the semiconductor memory device 50 can be reduced. Accordingly, the size of the semiconductor memory device 50 can be reduced. However, in this case, since the host accesses the storage memory 10 and the main memory 30 through one interface, the conventionally used memory access operation of the host 20 may be modified. The semiconductor memory device 50 using the structure of FIG. 3 may further include a controller 51 which is connected to the host 20 through a host interface 60. The controller 51 may receive a signal from the host 20 and may perform a function of transmitting the signal to the storage memory 10 or the main memory 30 based on the received signal. Here, a connection 53 between the controller 51, the storage memory 10, and the main memory may be at least one of a point-to-point connection performed by different connection lines, a switching method in which the connection between each other may change depending on time through a switch, or a method of connecting to each other by using a shared bus.

The electronic device including the host and the semiconductor memory device of FIGS. 1 to 3 may be a mobile device such as a mobile phone, a smartphone, an MP3 player, a laptop computer, a desktop computer, a game machine, a TV, a tablet PC, or an in-vehicle infotainment (IVI) system, etc., or may be a device which is fixed and used at a certain position such as a personal computer (PC), a server, etc.

The host 20 may be a CPU, a processor, a microprocessor, or an application processor (AP) and may be a main control unit of the electronic device. In some implementations, the electronic device may include an auxiliary control unit in addition to the main control unit. The auxiliary control unit may also function as a separate host 20.

The host interface 60 may mean a physical connection structure or a connection protocol for transmitting and receiving data and control signals between the external host 20 and the semiconductor memory devices 10, 40, and 50. The host interface 60 may have at least one of various interface types such as USB, Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), SD, MMC, eMMC, Dual In-line Memory Module (DIMM), Registered DIMM(RDIMM), Load Reduced DIMM (LRDIMM), etc.

Figure 4:
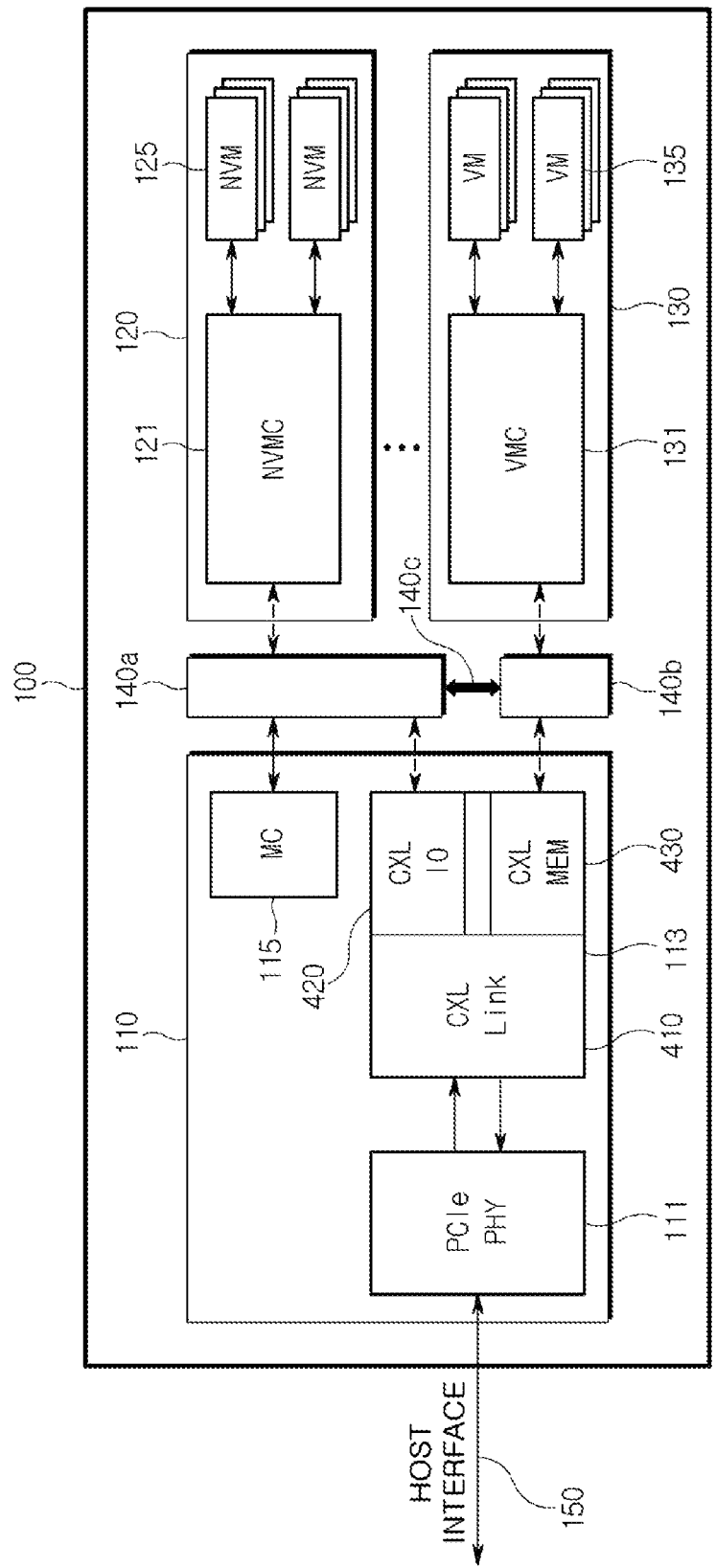
FIG. 4 shows an example of a configuration of a semiconductor memory device 100 based on various embodiments of the present disclosure.

FIG. 4 shows an example of a configuration of a semiconductor memory device 100 according to various embodiments of the present disclosure. The semiconductor memory device 100 having the configuration of FIG. 4 may be an example of the semiconductor memory device that can be used in the structure of the electronic device of FIG. 3.

Referring to FIG. 4, the semiconductor memory device 100 according to various embodiments of the present disclosure may include an access controller 110, a storage memory 120, a main memory 130, and crossbars 140a, 140b, and 140c for supporting data communication between respective main devices.

According to the embodiment, a plurality of storage memories 120 and/or a plurality of main memories 130 may be provided. According to various embodiments of the present disclosure, the access controller 110, each of the storage memories 120, and each of the main memories 130 may be a separate semiconductor chip or an integrated circuit (IC) and may be provided within the semiconductor memory device 100 and be connected to each other to provide memories required by the electronic device. In some implementations, the access controller 110 may be implemented as a single chip. In some other implementations, the access controller 110 may be implemented as multiple chips.

The main memory 130 may include a volatile memory controller (VMC) 131 and at least one volatile memory 135.

The volatile memory 135 is a physical device that stores data. Power must be applied to the volatile memory 135 in order to maintain stored information. When power is not applied, the stored information is deleted. The volatile memory 135 may be a dynamic random-access memory (DRAM), a synchronous DRAM (SDRAM), a double data rate SDRAM (DDR SDRAM), or a low power double data rate SDRAM (LPDDR SDRAM). According to various embodiments of the present disclosure, the LPDDR SDRAM that is the most suitable for a mobile device which may have a limited power consumption may be the most preferred as the volatile memory 135.

The volatile memory 135 operates in response to the control of the VMC 131 and may include a plurality of memory cells capable of storing data. Unlike a nonvolatile memory 125, the volatile memory 135 does not require a separate erase operation or a program operation, and direct writing and reading operations on each address of the volatile memory 135 may be possible. Accordingly, writing to the volatile memory 135 may be performed for each address, and the writing and reading operations on the volatile memory 135 can be performed for a short period of time.

Figure 5:
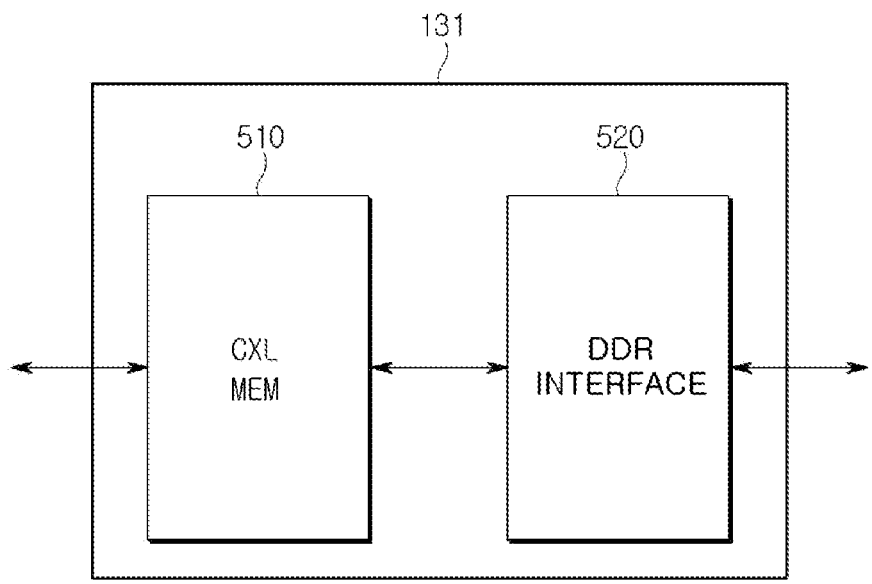
FIG. 5 shows an example of a configuration of a VMC 131 based on various embodiments of the present disclosure.

FIG. 5 shows a configuration of the VMC 131 according to various embodiments of the present disclosure.

Referring to FIG. 5, the VMC 131 may include a CXL memory interface (hereinafter, referred to as CXLMEM 510) for performing data communication based on a compute express link (CXL) memory protocol (CXL.mem) and may include a DDR interface 520 for controlling the volatile memory 135.

The CXLMEM 510 may perform data communication with a CXL memory interface (hereinafter, referred to as CXLMEM 430) of the access controller 110 based on the CXL memory protocol (CXL.mem). According to the embodiment, the CXLMEM 510 of the VMC 131 and the CXLMEM 430 of the access controller 110 may perform serial communication by using four connected signal lines.

The CXLMEM 510 may transmit a control signal for a read operation or a write operation received based on the CXL memory protocol (CXL.mem) to the DDR interface 520.

The DDR interface 520 may generate a hardware signal for controlling the volatile memory 135 based on the control signal received from the CXLMEM 510. Also, the DDR interface 520 may periodically or non-periodically generate a control signal of its own accord required for the volatile memory 135 to operate normally.

Referring back to FIG. 4, the storage memory 120 may include a nonvolatile memory controller (NVMC) 121 and the at least one nonvolatile memory 125.

The nonvolatile memory 125 is a physical device that stores data, and may be a NAND flash memory, a vertical NAND flash memory, a NOR flash memory, a resistive random-access memory (RRAM), a phase-change memory (PRAM), a magneto-resistive random-access memory (MRAM), a ferroelectric random-access memory (FRAM), a spin transfer torque random-access memory (STT-RAM), or others. For convenience of description in the present disclosure, it is assumed that the nonvolatile memory 125 is a NAND flash memory.

The nonvolatile memory 125 operates in response to the control of the NVMC 121 and may include a plurality of memory cells capable of storing data.

One memory cell may store one data bit, two data bits, three data bits, or four data bits depending on its structure.

The plurality of memory cells may be gathered to form one page. According to the embodiment, the page may indicate a minimum unit used to write data to the nonvolatile memory 125 or to read data from the nonvolatile memory 125.

A memory block has a concept including a plurality of pages, and may be used as a minimum unit when data is erased from the nonvolatile memory 125.

A memory cell array may have a concept including a plurality of memory blocks.

The nonvolatile memory 125 may be configured to receive a command and an address from the NVMC 121 and to access a region selected by the address in the memory cell array. That is, the nonvolatile memory 125 may perform an operation directed by the command with respect to the region selected by the address. For example, the nonvolatile memory 125 may perform a write operation (program operation), a read operation, and an erase operation. During the write operation, the nonvolatile memory 125 may store (program) data in the region selected by the address. During the read operation, the nonvolatile memory 125 may read the data from the region selected by the address. During the erase operation, the nonvolatile memory 125 may erase the data stored in the region selected by the address.

The nonvolatile memory 125 may store a logical to physical (L2P) map. The L2P map may include mapping information between a logical address in which the host 20 recognizes data as being stored and a physical address of the nonvolatile memory 125 in which the corresponding data is actually stored.

The NVMC 121 may control the overall operation of the storage memory 120.

When power is applied to the storage memory 120, the NVMC 121 may execute firmware (FW). When the nonvolatile memory 125 is a flash memory device, the NVMC 121 may execute firmware such as a flash translation layer (FTL) for data processing between the host 20 and the nonvolatile memory 125.

The NVMC 121 may control the nonvolatile memory 125 to execute the program operation, the read operation, or the erase operation according to a request of the host 20 or a main controller 115. During the program operation, the NVMC 121 may provide a write command, a physical block address, and data to the nonvolatile memory 125. During the read operation, the NVMC 121 may provide a read command and the physical block address to the nonvolatile memory 125. During the erase operation, the NVMC 121 may provide an erase command and the physical block address to the nonvolatile memory 125.

The NVMC 121 may generate a command, an address, and data of its own accord regardless of the request of the host 20 and may transmit them to the nonvolatile memory 125. For example, the NVMC 121 may provide a command, an address, and data to the nonvolatile memory 125 in order to perform background operations such as a program operation for wear leveling and a program operation for garbage collection.

Figure 6:
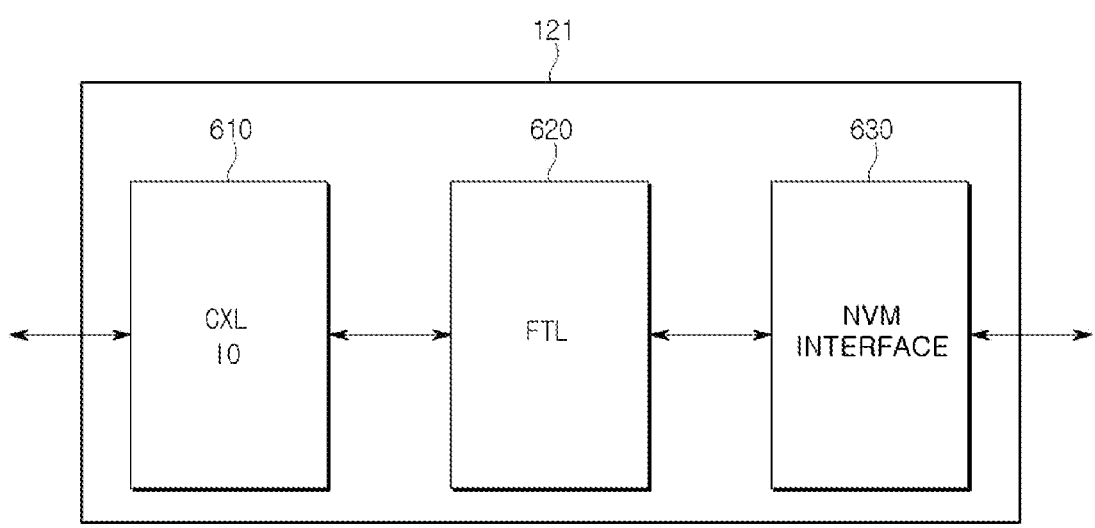
FIG. 6 shows an example of a configuration of an NVMC 121 based on various embodiments of the present disclosure.

FIG. 6 shows a configuration of the NVMC 121 according to various embodiments of the present disclosure.

Referring to FIG. 6, the NVMC 121 may include a CXL input/output interface (hereinafter, CXL IO 610), an FTL 620, and an NVM interface 630.

The CXL IO 610 may perform data communication with the main controller 115 and a CXL IO 420 of the access controller 110 based on a CXL input/output protocol (CXL.io). According to the embodiment, the CXL input/output protocol may be functionally equivalent to PCIe 5.0 protocol.

The CXL IO 610 may transmit a control signal for an NVM read operation or an NVM write operation received based on the CXL input/output protocol (CXL.io) to the FTL unit 620.

The FTL 620 may perform an NVM control operation in response to the control signal received through the CXL IO 610. For example, the FTL 620 may control an operation to write or program the data to the nonvolatile memory 125 in response to the received write request and may control an operation to read the data from the nonvolatile memory 125 in response to the read request. The FTL 620 may transmit the corresponding control signals to the NVM interface 630. The FTL 620 may perform an address mapping operation that maps the logical address of the host 20 to the physical address of the nonvolatile memory 125, in order to control the read operation or the write operation.

Also, the FTL 620 may perform background control so as to operate the nonvolatile memory 125 normally or efficiently. For example, the background control for the nonvolatile memory 125 may include garbage collection (GC), wear leveling (WL), map flush, bad block management, etc.

The NVM interface 630 may be configured to communicate with the nonvolatile memory 125 under the control of the FTL 620. Based on an interface method supported by the nonvolatile memory 125, the NVM interface 630 may provide the control signal, the address and/or the data to the nonvolatile memory 125 and may receive the data from the nonvolatile memory 125.

Referring back to FIG. 4, the access controller 110 may include a host access part 111, a memory access part 113, and the main controller 115. The host access part 111 may perform data communication with the host 20 through a host interface 150. The memory access part 113 is connected to the storage memory 120 and the main memory 130 through the crossbars 140a and 140b and performs data communication. The main controller 115 controls operations related to the NVM.

The host access part 111 is a module responsible for data communication with the host 20 and may use at least one of the above-described various interface methods. According to various embodiments for achieving the purpose of the present disclosure, a PCIe interface may be the most preferred as the host interface 150.

The PCIe interface is a high-speed serial interface for data input and output developed by the PCI Special Interest Group (SIG) under the leadership of Intel in 2002. Compared to an existing parallel bus, PCIe has advantages such as a larger bandwidth, a smaller number of input/output connection electrodes, a smaller form factor, an improved scalability, error detection, and hardware input/output virtualization support, etc. PCIe 6.0 standard standardized in 2021 may provide a link bandwidth of 64 G bit per second (bps) and a maximum bandwidth of 256 G byte per second (Bps) when multiple channels are used.

The memory access part 113 is a module which is connected to the storage memory 120 and the main memory 130 through the crossbars 140a and 140b by a point-to-point or by a bus and performs data communication. The memory access part 113 may include a CXL interface function.

The CXL interface is an interface standard proposed in 2019 for data transmission between computer devices. The CXL interface uses the same physical and link protocols as PCIe 5.0 and may provide a bandwidth of 128 GBps by using up to 16 channels. A physical layer protocol of the CXL interface may be divided into three types. The three types may include the input/output protocol (CXL.io) for data input/output, the memory protocol (CXL.mem) that allows a host processor to coherently access the memory connected to the CXL interface, and a cache protocol (CXL.cache) that allows a CXL interface controller to access a system memory.

The memory access part 113 may include a CXL link 410 that controls data communication based on the CXL interface, a CXL IO 420 that performs data communication based on the input/output protocol (CXL.io) among the three types of the CXL physical layer protocols, and a CXLMEM 430 that performs data communication based on the memory protocol (CXL.mem).

The CXL link 410 of the memory access part 113 may be communicatively connected to the host access part 111. The CXL link 410 may receive, from the host access part 111, a memory access request coming from the host 20, and accordingly, the CXL link 410 may generate a data frame for accessing one of the storage memory 120 or the main memory 130.

The CXL IO 420 provided in the memory access part 113 may perform data communication with the storage memory 120. The CXL IO 420 may include functions such as search, enumeration, and error reporting of the CXL device and may require conversion between the logical address and the physical address in the CXL device. According to the embodiment, when the semiconductor memory device 100 includes the plurality of storage memories 120, the memory access part 113 may include a plurality of CXL IO 420 corresponding thereto.

In a similar manner to the fact that the conventional host 20 accesses the main memory 130, the CXLMEM 430 may use the memory protocol (CXL.mem) that allows the host to access the memory through a consistent address system. When the semiconductor memory device 100 includes the plurality of main memories 130, the memory access part 113 may include a plurality of CSLMEM 430 corresponding thereto.

The main controller 115 may perform data processing related to the NVM. According to the embodiment, the main controller 115 may be implemented to process the NVMe protocol.

When the host 20 requests NVM access, the main controller 115 may obtain a command from the host 20 and may perform a process according to the command.

For example, when data write to the NVM 125 is requested, the host 20 may write, in a buffer within the host or in the main memory 130, a command to write data to the NVM 125. Then, the host 20 may transmit, to the main controller 115, a notification message informing the main controller 115 that there is an NVM access command.

After receiving the notification message, the main controller 115 may obtain the command from the buffer or the main memory 30 in which the command is written, and may transmit a processing request to the NVMC 121 based on the corresponding command. In this case, the main controller 115 directly obtains the data to be written and transmits the data to the NVMC 121 or notifies the NVMC 121 of only addresses with the data to be written, so that the NVMC 121 can obtain the data to be written from the corresponding address.

According to the embodiment, the message transmitted from the host 20 to the main controller 115 may be transmitted from the memory access part 113 to the main controller 115 through the crossbar 140a. According to another embodiment, the message transmitted from the host 20 to the main controller 115 may be transmitted between the memory access part 113 and the main controller 115 through a transmission path connected to the inside of the chip.

The crossbars 140a and 140b may provide a connection path for data communication between the memory access part 113, the main controller 115, the storage memory 120, and the main memory 130.

According to the embodiment, the crossbars 140a and 140b may be implemented by a point-to-point connection, a bus, or a crossbar switch. When the crossbars 140a and 140b are implemented by the point-to-point connection, a data communication line that one-to-one connects all the entities connected to the crossbars 140a and 140b may be provided. When the crossbars 140a and 140b are implemented by the bus, all the entities connected to the crossbars 140a and 140b may be connected to the bus, and data communication may be performed based on an identifier (ID) for each entity. When the crossbars 140a and 140b are implemented by the crossbar switch, data communication can be possible by temporarily one-to-one connecting the entities through the control of the crossbars 140a and 140b switches.

According to the embodiment, as shown in FIG. 4, in the crossbars 140a and 140b, the crossbar 140a that connects only the entities related to CXL.IO and the crossbar 140b that connects only the entities related to CXL.mem may be separately provided. In this case, a connection path 140c enabling data communication between the crossbar 140a and the crossbar 140b may be provided. In this case, the connection path 140c may be recognized as one entity in each crossbar.

According to another embodiment, the crossbar may be composed of one crossbar to which all the entities can be connected.

As shown in FIG. 4, the semiconductor memory device proposed by the present disclosure includes both the main memory 130 and the storage memory 120 within one module, and thus, data can be directly transmitted between the main memory 130 and the storage memory 120 without going through the host 20. Accordingly, data transmission speed can be significantly improved.

FIGS. 7 to 10 show an operation related to the NVM access according to various embodiments of the present disclosure.

Figure 7:
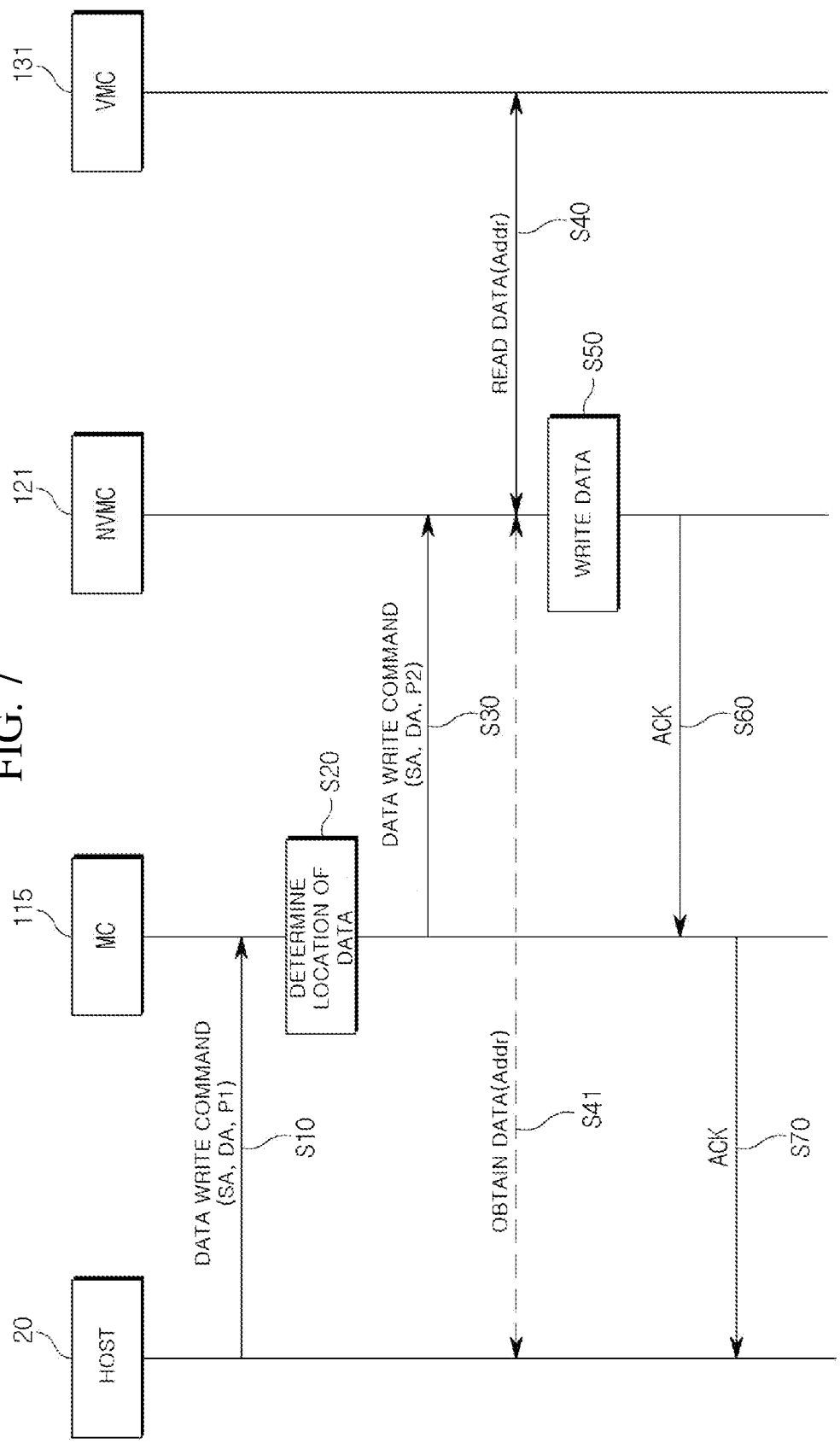
FIGS. 7 to 10 show examples of operations related to NVM access based on various embodiments of the present disclosure.
Figure 8:
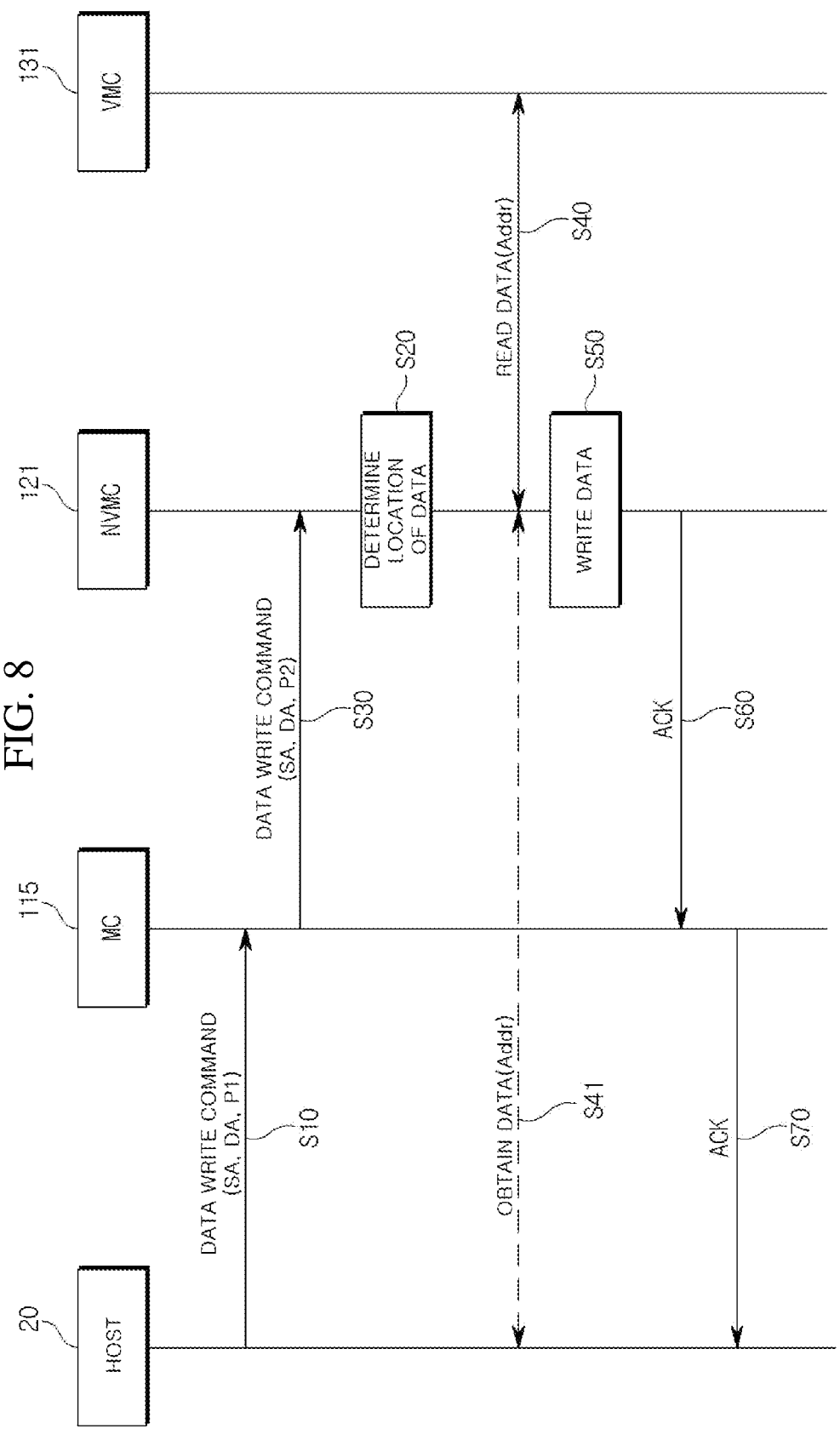

FIGS. 7 and 8 relate to the write operation of data to the NVM 125. FIG. 7 shows an example in which the main controller 115 determines the location of the data to be written, and FIG. 8 shows an example in which the NVMC 121 determines the location of the data to be written.

Referring to FIGS. 7 and 8, in step S10, the host 20 may transmit an NVM data write command to the main controller 115.

The host 20 transmits the NVM data write command to the main controller 115 in various manners depending on a protocol used.

According to the embodiment, in a case where the NVMe protocol is used, when the host 20 intends to transmit the NVM data write command, the host 20 may first generate the NVM data write command and may store the NVM data write command in the main memory 30 or in the buffer related to the host 20. According to the embodiment, the host 20 may allocate in advance a buffer area or the main memory 30 capable of storing a plurality of commands in the form of a circular FIFO, and may sequentially store the commands in the circular FIFO. In addition, the host 20 may notify the main controller 115 that the data write command is stored in the main controller 115.

The main controller 115 may obtain the NVM data write command from the buffer in the host 20 or from the main memory 30 based on the received notification message. It has been described that the host 20 may transmit, to the main controller 115, the notification message informing the NVM access command after the host 20 writes the command to write data to the NVM 125. According to the embodiment, the main controller 115 determines in which of the host 20 and the main memory 30 the NVM data write command is stored, based on the address at which the NVM data write command is stored, and may determine a port from which the data is obtained, accordingly. Here, the port may correspond to each entity and may be a connection point between the crossbar 140a and the entity. According to the embodiment, when the crossbar 140a is a bus, the port may have a hardware configuration connected to the bus in each entity. Accordingly, when the NVM data write command is stored in the main memory 130, the main controller 115 may generate a message that allows the NVM data write command to be read from the main memory 130 and may transmit the message to a main memory 130 side port. In the embodiment, when the crossbar 140a is a bus, the main controller 115 may transmit a message including a destination identifier that can refer to the main memory 130 to all the entities through the bus. Then, the destination identifier included in the message corresponds to the corresponding entity (main memory), and data may be read and transmitted to the main controller 115.

Referring to FIG. 7, in step S20, the main controller 115 may determine a location where the data to be written is stored. According to the embodiment, the main controller 115 may determine the location where the data to be written is stored based on source address information included in the NVM write command. In addition, in step S30, the main controller 115 may transmit a data write command to the NVMC 121 together with information on the determined location where the data to be written is stored.

Referring to FIG. 8, in step S30, the main controller 115 may transmit the data write command to the NVMC 121, and in step S20, the NVMC 121 may determine the location where the data to be written is stored.

The main controller 115 or each NVMC 121 may determine the location of the data to be written. However, in order to determine the data location, there is a requirement for logical address information referred to by the host 20 (e.g., information on an address area specifying the main memory 30, information on an address area specifying each main memory when there is a plurality of main memories 30). It may be preferable that the main controller 115 should determine the data location.

Meanwhile, the structure of the data write command or information included in the data write command transmitted from the host 20 to the main controller 115 is completely different from the structure of the data write command or information included in the data write command transmitted from the main controller 115 to the NVMC 121.

Referring to FIGS. 7 and 8, in step S40 or S41, the NVMC 121 may obtain the data from the host 20 or the main memory 30 in accordance with the determined data location. Here, the format of the message transmitted to the host 20 or the main memory 30 by the NVMC 121 in order to obtain the data to be stored may be completely different.

In step S50, the NVMC 121 may write the obtained data to the NVM 125.

In step S60, the NVMC 121 may transmit a message indicating that the data writing has been completed to the main controller 115. In step S70, the main controller 115 may transmit the message indicating that the data writing has been completed to the host 20.

Referring to FIGS. 7 and 8, when the data to be stored or the command generated by the host is stored in the main memory 30, the NVMC 121 and the main controller 115 may directly obtain necessary data from the main memory 30 without going through the host 20. Accordingly, it is possible to increase the overall command execution speed required to write the data to the NVM.

Figure 9:
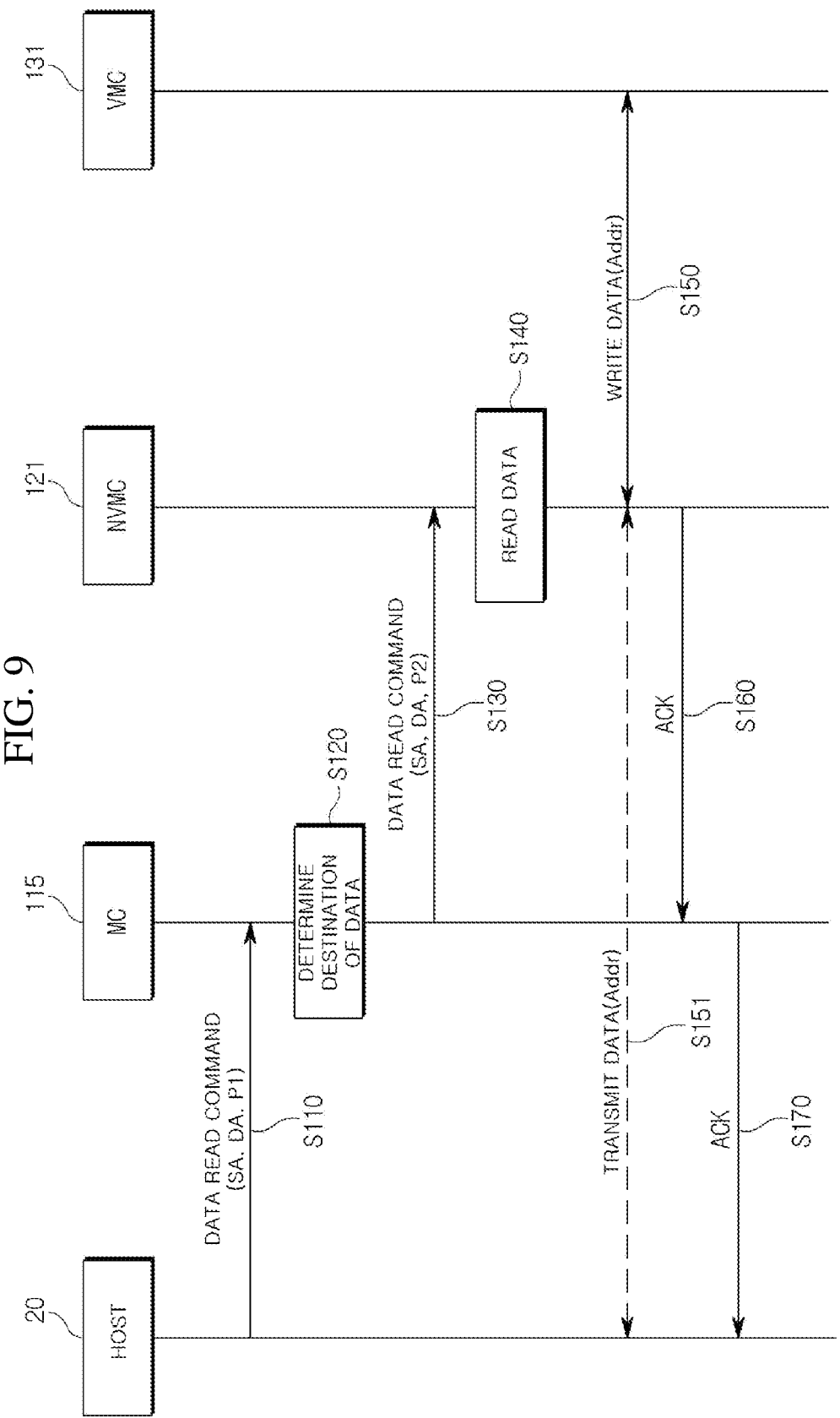
Figure 10:
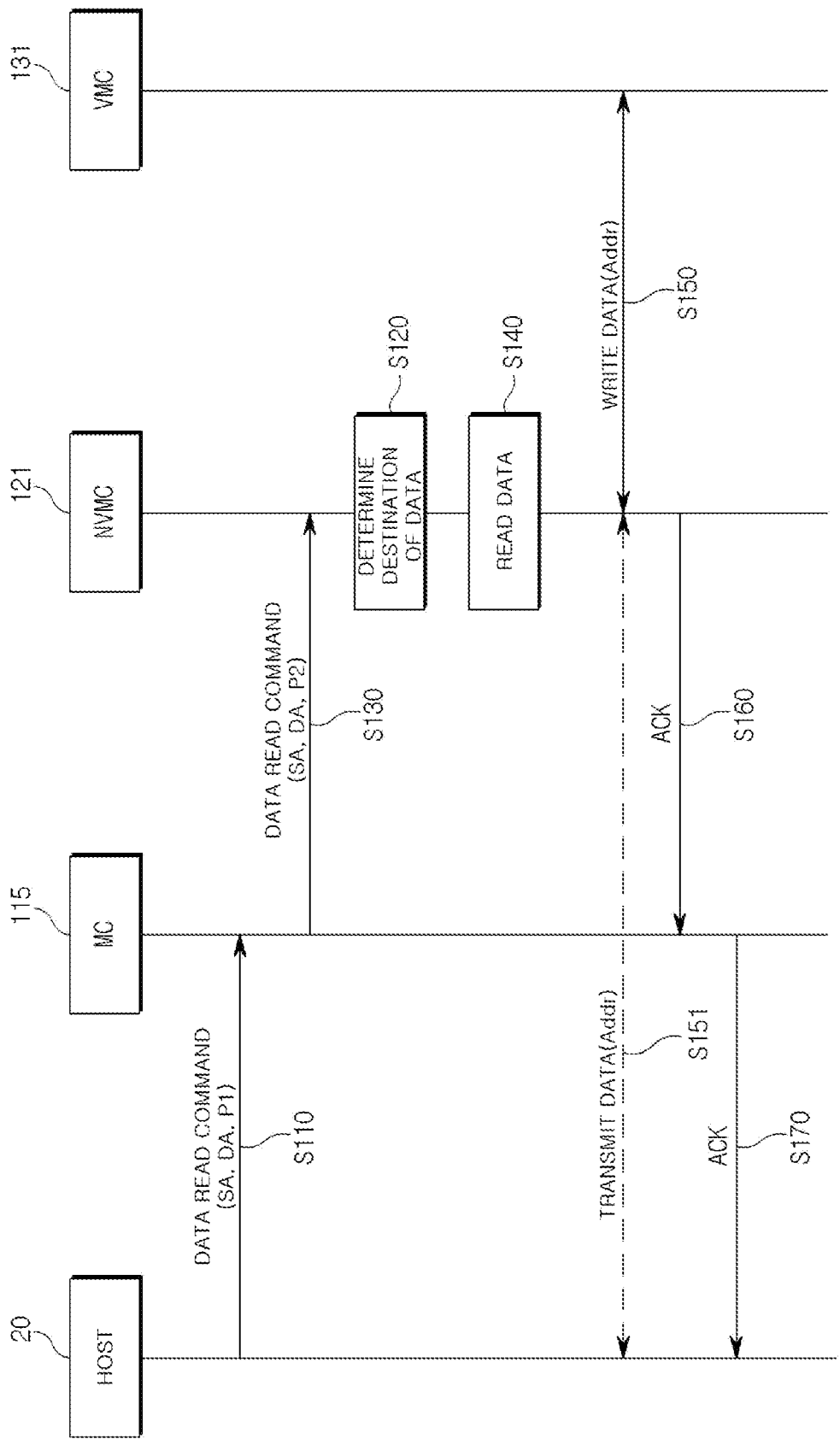

FIGS. 9 and 10 relate to the operation to read the data from the NVM 125. FIG. 9 shows an example in which the main controller 115 determines a destination to which the read data is transmitted. FIG. 10 shows an example in which the NVMC 121 determines a destination to which the read data is transmitted.

Referring to FIGS. 9 and 10, in step S110, the host 20 may transmit an NVM data read command to the main controller 115.

The host 20 may transmit an NVM data read command to the main controller 115 in various manners depending on a protocol used.

According to the embodiment, in a case where the NVMe protocol is used, when the host 20 intends to transmit the NVM data read command, the host 20 may first generate the NVM data read command and may store the NVM data read command in the main memory 30 or in the buffer in the host 20. Then, the host 20 may notify the main controller 115 that the NVM data read command is stored. In some implementations, the host 20 transmits the notification message to the main controller 115 in the similar manner as that the host 20 transmits the notification message in relation to the write command, as shown in FIGS. 7 and 8. In some implementations, the format of the notification message may be the same as that of the notification message in relation to the write command.

The main controller 115 may obtain the NVM data read command from the buffer in the host 20 or from the main memory 30 based on the received notification message. According to the embodiment, the main controller 115 determines where the NVM data read command is stored in the buffer in the host 20 or the main memory 30, based on the address at which the NVM data read command is stored, and may determine a port from which the data is obtained, accordingly. Here, the port may correspond to each entity and may be a connection point between the crossbar 140*a* and the entity. According to the embodiment, when the crossbar 140*a* is a bus, the port may have a hardware configuration connected to the bus in each entity. Accordingly, when the NVM data read command is stored in the main memory 130, the main controller 115 may generate a message that allows the NVM data read command to be read from the main memory 130 and may transmit the message to a main memory 130 side port. In the embodiment, when the crossbar 140*a* is a crossbar switch, the main controller 115 may control the crossbar switch such that the port of the main memory 130 and the port of the main controller 115 are connected.

Referring to FIG. 9, in step S120, the main controller 115 may determine a destination of the data to be read from the NVM. According to the embodiment, the main controller 115 may determine the destination in which the data is to be stored based on destination address information included in the NVM read command. In step S130, the main controller 115 may transmit the data read command to the NVMC 121 together with information on the destination in which the data is to be stored.

Referring to FIG. 10, in step S130, the main controller 115 may transmit the data read command to the NVMC 121, and in step S120, the NVMC 121 may determine the destination to which the data is to be transmitted.

The main controller 115 or each NVMC 121 may determine the destination to which the data is to be transmitted. However, in order to determine the destination of the data, there is a requirement for logical address information referred to by the host 20 (e.g., information on an address area specifying the main memory 30, information on an address area specifying each main memory when there is a plurality of main memories 30). It may be preferable that the main controller 115 should determine the data location.

Meanwhile, the structure of the data read command or information included in the data read command transmitted from the host 20 to the main controller 115 is completely different from the structure of the data read command or information included in the data read command transmitted from the main controller 115 to the NVMC 121.

Referring to FIGS. 9 and 10, in step S140, the NVMC 121 may read the data from the NVM 125.

In step S150 or S151, the NVMC 121 may transmit the data to the host 20 or the main memory 30 in accordance with the determined destination of the data. Here, the format of the message transmitted to the host 20 or the main memory 30 by the NVMC 121 in order to transmit the data may be completely different.

In step S160, the NVMC 121 may transmit a message indicating that the data reading has been completed to the main controller 115. In step S170, the main controller 115 may transmit the message indicating that the data reading has been completed to the host 20.

Referring to FIGS. 9 and 10, when the destination of the data or the command generated by the host is stored in the main memory 30, the NVMC 121 and the main controller 115 may directly obtain necessary data from the main memory 30 without going through the host 20. Accordingly, it is possible to increase the overall command execution speed required to read the data from the NVM.

As described above, the access controller 110 proposed in the present disclosure may include a first interface 111 that performs data communication with a first external device 20 based on a first protocol, a second interface 420 that performs data communication with a second external device 120 including a nonvolatile memory, based on a second protocol, a third interface 430 that performs data communication with a third external device 130 including a volatile memory, based on a third protocol, a main controller 115 that controls access to the nonvolatile memory, and a link unit that processes a first message received through the first interface, generates a second message based on the second protocol and transmits the second message to the second external device through the second interface, generates a third message based on the third protocol and transmits the third message to the third external device through the third interface, or transmits the processed first message to the controller.

According to various embodiments of the present disclosure, the access controller 110 may further include a fourth interface based on the second protocol, and the controller 115 may generate a fourth message based on the second protocol based on the first message and may transmit the fourth message to the second external device 120 through the fourth interface.

According to various embodiments of the present disclosure, the access controller 110 may further include a first crossbar configured to enable data communication by connecting the second interface, the fourth interface, and the second external device to each other, a second crossbar configured to enable data communication by connecting the third interface and the third external device to each other, and a third crossbar configured to connect the first crossbar and the second crossbar.

According to various embodiments of the present disclosure, the first interface may be a peripheral component interconnection express (PCIe) interface, the second interface may be a compute express link.io (CXL.io) interface, and the third interface may be a CXL.mem interface.

According to various embodiments of the present disclosure, the controller may operate based on a nonvolatile memory express (NVMe) protocol, and the first message may be a message according to the NVMe protocol.

According to various embodiments of the present disclosure, when the first message includes a command for writing data to the nonvolatile memory, the controller may determine whether a location where the data to be written to the nonvolatile memory is to be obtained is the third external device or the first external device, and when the location is the third external device, the controller may generate the fourth message including a command for allowing the second external device to directly obtain the data from the third external device, and may transmit the fourth message to the second external device through the fourth interface.

According to various embodiments of the present disclosure, when the first message includes a command for reading data to the nonvolatile memory, the controller may determine whether a destination to which the data read from the nonvolatile memory is to be transmitted is the third external device or the first external device, and when the destination is the third external device, the controller may generate the fourth message including a command for allowing the second external device to directly transmit the data to the third external device, and may transmit the fourth message to the second external device through the fourth interface.

According to various embodiments of the present disclosure, the semiconductor memory device 100 includes a storage memory 120 including a nonvolatile memory 125 and a nonvolatile memory controller 121 which controls the nonvolatile memory, a main memory 130 including a volatile memory 135 and a volatile memory controller 131 which controls the volatile memory, and an access controller 110 that performs data communication with an external device 20 based on a first protocol, performs data communication with the storage memory based on a second protocol, performs data communication with the main memory based on a third protocol, and controls access from the external device to the storage memory and the main memory.

According to various embodiments of the present disclosure, the semiconductor memory device 100 may further include a first crossbar configured to connect the access controller and the storage memory and enable data communication, a second crossbar configured to connect the access controller and the main memory and enable data communication, and a third crossbar configured to connect the first crossbar and the second crossbar.

According to various embodiments of the present disclosure, the access controller may include a first interface that performs data communication with the external device based on the first protocol, a second interface that performs data communication with the storage memory based on the second protocol, a third interface that performs data communication with the main memory based on the third protocol, a controller that controls access to the nonvolatile memory, and a link unit that processes a first message received from the external device through the first interface, generates a second message based on the second protocol and transmits the second message to the storage memory through the second interface, generates a third message based on the third protocol and transmits the third message to the main memory through the third interface, or transmits the processed first message to the controller.

According to various embodiments of the present disclosure, the access controller may further include a fourth interface based on the second protocol. The controller generates a fourth message based on the second protocol based on the first message and transmits the fourth message to the storage memory through the fourth interface.

According to various embodiments of the present disclosure, the second interface and the fourth interface of the access controller are connected to the first crossbar. The third interface of the access controller is connected to the second crossbar.

According to various embodiments of the present disclosure, the storage memory, the main memory, and the access controller may be composed of separate chips and may be arranged within the semiconductor memory device and may be connected to each other through the first crossbar, the second crossbar, and the third crossbar.

According to various embodiments of the present disclosure, the semiconductor memory device may include a plurality of storage memory chips and a plurality of main memory chips. The access controller chip may include a plurality of first ports which is connected to the plurality of the storage memory chips respectively and a plurality of second ports which is connected to the plurality of the main memory chips respectively. The first crossbar connects the plurality of first ports and the plurality of storage memory chips respectively. The second first crossbar connects the plurality of second ports and the plurality of main memory chips respectively.

According to various embodiments of the present disclosure, the semiconductor memory device comprises a plurality of the storage memory chips and a plurality of the main memory chips. The access controller chip comprises a first port which is connectable to one of the plurality of storage memory chips and a second port which is connectable to one of the plurality of main memory chips. The first crossbar comprises a first switching element which connects the first port to one of the plurality of storage memory chips. The second crossbar comprises a second switching element which connects the second port to one of the plurality of main memory chips.

According to various embodiments of the present disclosure, the semiconductor memory device further may further include a substrate. The access controller chip is disposed on the substrate. The plurality of main memory chips may be stacked on the substrate vertically on both sides spaced apart from the access controller chip. The plurality of storage memory chips may be disposed on the plurality of main memory chips disposed on both sides of the access controller chip while being vertically stacked.

According to various embodiments of the present disclosure, a plurality of connection electrodes disposed under the substrate may be further included. The plurality of connection electrodes may include a connection electrode for connection with the host through the first interface and a connection electrode for power supply.

Hereinafter, the arrangement structure of the semiconductor memory device 100 proposed by the present disclosure will be described in more detail.

Figure 11:
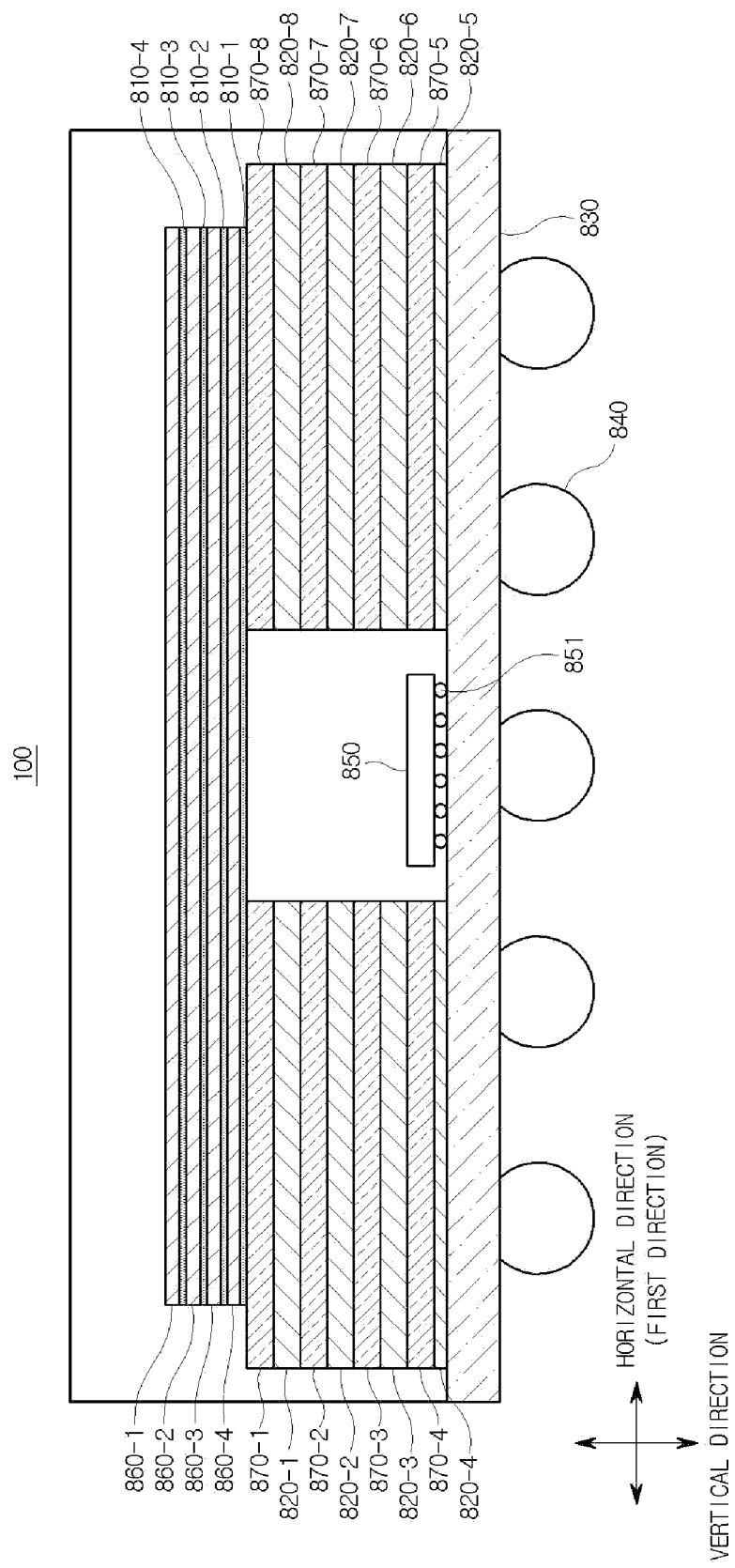
FIG. 11 is a cross-sectional view showing an arrangement structure of each chip in a semiconductor memory device based on various embodiments of the present disclosure.

FIG. 11 is a cross-sectional view showing an arrangement structure of each chip in the semiconductor memory device 100 according to various embodiments of the present disclosure. It is described as an example that the semiconductor memory device 100 shown in FIG. 11 includes the plurality of storage memories 120 and the plurality of main memories 130.

Referring to FIG. 11, the semiconductor memory device 100 according to various embodiments of the present disclosure may include a substrate 830, a first semiconductor chip 850 disposed on one surface of the substrate 830, for example, a top surface of the substrate 830, at least one second semiconductor chip 870-1 to 870-8 which is vertically stacked while being spaced apart from both sides of the first semiconductor chip 850 by a predetermined distance and, at least one third semiconductor chip 860-1 to 860-4 which is provided on the at least one second semiconductor chip 870-1 to 870-8 stacked while being spaced apart from both sides of the first semiconductor chip 850, and an external connection electrode 840 which is disposed on the other surface of the substrate 830, for example, a bottom surface of the substrate 830. According to the embodiment, the first semiconductor chip 850 may be the access controller 110 of FIG. 4, and the second semiconductor chips 870-1 to 870-8 may be the main memory 130 of FIG. 4. The third semiconductor chips 860-1 to 860-4 may be the storage memory 120 of FIG. 4.

The substrate 830 may include a circuit and/or a wiring structure which electrically connects the first semiconductor chip 850, at least one second semiconductor chip 870-1 to 870-8, and at least one third semiconductor chip 860-1 to 860-4 to the external connection electrode 840. For example, the substrate 830 may include a printed circuit board (PCB), an interposer, and a redistribution layer. Various upper substrate pads (not shown) for connection to the first semiconductor chip 850, at least one second semiconductor chip 870-1 to 870-8, and at least one third semiconductor chip 860-1 to 860-4 may be disposed on the top surface of the substrate 830. Also, various lower substrate pads (not shown) for connection to the external connection electrode 840 may be disposed on the bottom surface of the substrate 830. These upper substrate pads and lower substrate pads may be a part of the circuit and/or wiring structure of the substrate 830 or may be electrically connected to the circuit and/or wiring structure.

The first semiconductor chip 850 may be disposed on the top surface of the substrate 830, and the at least one second semiconductor chip 870-1 to 870-8 may be disposed on both sides of the first semiconductor chip 850 and may be disposed to be spaced apart from the first semiconductor chip 850 in a first direction of the first semiconductor chip 850 by a certain distance. The at least one second semiconductor chip 870-1 to 870-8 may be stacked in a vertical direction. Each of the at least one second semiconductor chip 870-1 to 870-8 may be attached to the top surface of the second semiconductor chips 870-2 to 870-7 positioned just below themselves 870-1 to 870-8 or the top surface of the first semiconductor chip 850, through adhesive layers 820-1 to 820-8 formed on a non-active surface. The adhesive layers 820-1 to 820-8 may include an insulating adhesive material such as a die attach film (DAF), etc.

The at least one third semiconductor chip 860-1 to 860-4 may be disposed on the at least one second semiconductor chip 870-1 to 870-8. A plurality of at least one third semiconductor chip 860-1 to 860-4 may be stacked in a vertical direction. Here, the at least one third semiconductor chip 860-1 to 860-4 may be disposed across both the at least one second semiconductor chip 870-1 to 870-4 disposed on one side of the first semiconductor chip 850 and the at least one second semiconductor chip 870-5 to 870-8 disposed on the other side of the first semiconductor chip 850 in a horizontal direction. Each of the at least one third semiconductor chip 860-1 to 860-4 may be attached to the top surface of the third semiconductor chip positioned just below themselves 860-1 to 860-4 or the top surface of the at least one second semiconductor chip 870-1 to 870-8, through adhesive layers 810-1 to 810-4 formed on a non-active surface. The adhesive layers 810-1 to 810-4 may include an insulating adhesive material such as DAF, or others.

A plurality of the external connection electrodes 840 may be disposed on the bottom surface of the substrate 830. The external connection electrode 840 may have various shapes such as a pillar shape, a ball shape, or a combination thereof, and may include various conductive materials such as a solder material, a metal material, or a combination thereof.

As described above, the present disclosure describes a semiconductor memory device that provides the main memory and the storage memory included in an electronic device, for example, a mobile electronic device. According to various embodiments of the present disclosure, the described semiconductor memory device is connected to the host only by using a single interface, for example, a PCIe interface, thereby reducing the number of the external connection electrodes required and reducing the size of the package accordingly.

In some implementations, using the multi-chip package according to various embodiments of the present disclosure can be used to reduce a cost at a chip level and a cost at a system level.

In addition, by using the multi-chip package according to various embodiments of the present disclosure, the degree of system integration at a board level can be advantageously increased in certain implementations of the disclosed technology.

Furthermore, by using the multi-chip package according to various embodiments of the present disclosure in certain implementations, the performance of the main memory and the storage memory can be optimized.

While this patent document contains certain specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Only a few implementations and examples are described and other implementations, enhancements and variations can be made based on what is described and illustrated in this patent document.

I claim:
1. An access controller comprising:
a first interface configured to perform data communication based on a first protocol with a first external device;
a second interface configured to perform data communication based on a second protocol with a second external device comprising a nonvolatile memory;

a third interface configured to perform data communication based on a third protocol with a third external device comprising a volatile memory;
a controller communicatively coupled to the second external device and configured to control an access to the nonvolatile memory;
a link communicatively coupled to the controller, the first interface, the second interface, and the third interface and configured to process a first message received through the first interface, generate a second message based on the second protocol and transmit the second message to the second external device through the second interface, generate a third message based on the third protocol and transmit the third message to the third external device through the third interface, or transmit the processed first message to the controller;
a fourth interface based on the second protocol, wherein the controller is configured to generate a fourth message based on the second protocol based on the first message and transmit the fourth message to the second external device through the fourth interface;
a first crossbar configured to enable data communication by connecting the second interface, the fourth interface, and the second external device to one another;
a second crossbar configured to enable data communication by connecting the third interface and the third external device to each other; and
a third crossbar configured to connect the first crossbar and the second crossbar.

2. The access controller of claim 1,
wherein the first interface is a peripheral component interconnection express (PCIe) interface, the second interface is a compute express link.io (CXL.io) interface, and the third interface is a CXL.mem interface.

3. The access controller of claim 1,
wherein the controller operates based on a nonvolatile memory express (NVMe) protocol, and the first message is a message based on the NVMe protocol.

4. The access controller of claim 1,
wherein, when the first message comprises a command for writing data to the nonvolatile memory, the controller is configured to determine whether a location where the data to be written to the nonvolatile memory is to be obtained is the third external device or the first external device, and
wherein, when the location is the third external device, the controller is configured to generate the fourth message comprising a command for allowing the second external device to directly obtain the data from the third external device, and transmit the fourth message to the second external device through the fourth interface.

5. The access controller of claim 1,
wherein, when the first message comprises a command for reading data from the nonvolatile memory, the controller is configured to determine whether a destination to which the data read from the nonvolatile memory is to be transmitted is the third external device or the first external device, and
wherein, when the destination is the third external device, the controller is configured to generate the fourth message comprising a command for allowing the second external device to directly transmit the data to the third external device, and transmit the fourth message to the second external device through the fourth interface.

6. A semiconductor memory device comprising:
a storage memory comprising a nonvolatile memory and a nonvolatile memory controller configured to control the nonvolatile memory;
a main memory comprising a volatile memory and a volatile memory controller configured to control the volatile memory;
an access controller communicatively coupled to the storage memory and the main memory and configured to perform data communication with an external device based on a first protocol, perform data communication with the storage memory based on a second protocol, perform data communication with the main memory based on a third protocol, and control access from the external device to the storage memory and the main memory;
a first crossbar configured to enable data communication by connecting the access controller and the storage memory;
a second crossbar configured to enable data communication by connecting the access controller and the main memory; and
a third crossbar configured to connect the first crossbar and the second crossbar.

7. The semiconductor memory device of claim 6,
wherein the access controller comprises:
a first interface configured to perform data communication with the external device based on the first protocol;
a second interface configured to perform data communication with the storage memory based on the second protocol;
a third interface configured to perform data communication with the main memory based on the third protocol;
a controller configured to control an access to the nonvolatile memory; and
a link configured to process a first message received from the external device through the first interface, generate a second message based on the second protocol and transmit the second message to the storage memory through the second interface, generate a third message based on the third protocol and transmit the third message to the main memory through the third interface, or transmit the processed first message to the controller.

8. The semiconductor memory device of claim 7,
wherein the access controller further comprises a fourth interface based on the second protocol,
wherein the controller is configured to generate a fourth message based on the second protocol based on the first message and transmit the fourth message to the storage memory through the fourth interface.

9. The semiconductor memory device of claim 8,
wherein the second interface and the fourth interface of the access controller are connected to the first crossbar,
and wherein the third interface of the access controller is connected to the second crossbar.

10. The semiconductor memory device of claim 8,
wherein, when the first message comprises a command for writing data to the nonvolatile memory, the controller is configured to determine whether a location where the data to be written to the nonvolatile memory is to be obtained is the main memory or the external device, and
wherein, when the location is the main memory, the controller is configured to generate the fourth message comprising a command for allowing the storage memory to directly obtain the data from the main memory, and transmit the fourth message to the storage memory through the fourth interface.

11. The semiconductor memory device of claim 8,
wherein, when the first message comprises a command for reading data from the nonvolatile memory, the controller is configured to determine whether a destination to which the data read from the nonvolatile memory is to be transmitted is the main memory or the external device, and
wherein, when the destination is the main memory, the controller is configured to generate the fourth message comprising a command for allowing the storage memory to directly transmit the data to the main memory, and transmit the fourth message to the storage memory through the fourth interface.

12. The semiconductor memory device of claim 7,
wherein the first interface is a peripheral component interconnection express (PCIe) interface, the second interface is a compute express link.io (CXL.io) interface, and the third interface is a CXL.mem interface.

13. The semiconductor memory device of claim 7,
wherein the controller is configured to operate based on a nonvolatile memory express (NVMe) protocol, and the first message is a message based on the NVMe protocol.

14. The semiconductor memory device of claim 6,
wherein the storage memory, the main memory, and the access controller are implemented as separate chips and are arranged within the semiconductor memory device and are connected to each other through the first crossbar, the second crossbar, and the third crossbar.

15. The semiconductor memory device of claim 14,
wherein the semiconductor memory device comprises a plurality of the storage memory chips and a plurality of the main memory chips,
wherein the access controller chip comprises a plurality of first ports which is connected to the plurality of storage memory chips, respectively, and a plurality of second ports which is connected to the plurality of main memory chips, respectively,
wherein the first crossbar connects the plurality of first ports and the plurality of the storage memory chips,
and wherein the second first crossbar connects the plurality of second ports and the plurality of the main memory chips.

16. The semiconductor memory device of claim 15, further comprising a substrate,
wherein the access controller chip is disposed on the substrate,
wherein the plurality of main memory chips is stacked on the substrate vertically on both sides spaced apart from the access controller chip,
wherein the plurality of storage memory chips is disposed on the plurality of main memory chips disposed on both sides of the access controller chip while being vertically stacked.

17. The semiconductor memory device of claim 14,
wherein the semiconductor memory device comprises a plurality of the storage memory chips and a plurality of the main memory chips,
wherein the access controller chip comprises a first port that is connectable to one of the plurality of storage memory chips and a second port which is connectable to one of the plurality of main memory chips,
wherein the first crossbar comprises a first switching element which connects the first port to one of the plurality of storage memory chips, and
wherein the second crossbar comprises a second switching element which connects the second port to one of the plurality of main memory chips.

18. An access controller comprising:
a first interface configured to perform data communication based on a first protocol with a first external device;
a second interface configured to perform data communication based on a second protocol with a second external device comprising a nonvolatile memory;
a third interface configured to perform data communication based on a third protocol with a third external device comprising a volatile memory;
a controller communicatively coupled to the second external device and configured to control an access to the nonvolatile memory;
a link communicatively coupled to the controller, the first interface, the second interface, and the third interface and configured to process a first message received through the first interface, generate a second message based on the second protocol and transmit the second message to the second external device through the second interface, generate a third message based on the third protocol and transmit the third message to the third external device through the third interface, or transmit the processed first message to the controller;
a fourth interface based on the second protocol, wherein the controller is configured to generate a fourth message based on the second protocol based on the first message and transmit the fourth message to the second external device through the fourth interface; and
wherein the first interface is a peripheral component interconnection express (PCIe) interface, the second interface is a compute express link.io (CXL.io) interface, and the third interface is a CXL.mem interface.

19. The access controller of claim 18, wherein the first interface is a peripheral component interconnection express (PCIe) interface, the second interface is a compute express link.io (CXL.io) interface, and the third interface is a CXL.mem interface.

20. The access controller of claim 18, wherein the controller operates based on a nonvolatile memory express (NVMe) protocol, and the first message is a message based on the NVMe protocol.

* * * * *

(12) SUPPLEMENTAL EXAMINATION CERTIFICATE

United States Patent
Lee

(10) Number: US 12,197,777 F1
(45) Certificate Issued: Jan. 12, 2026

Control No.: 96/050,130

Filing Date: Dec. 23, 2025

Primary Examiner: Ovidio Escalante

No substantial new question of patentability is raised in the request for supplemental examination. See the Reasons for Substantial New Question of Patentability Determination in the file of this proceeding.

(56) Items of Information

U.S. PATENT DOCUMENTS

| | | |
|---|---|---|
| 2015/0067234 | 3/2015 | Shin et al. |
| 2021/0365193 | 11/2021 | Hong et al. |